(12) United States Patent
Jedema et al.

(10) Patent No.: US 7,791,937 B2
(45) Date of Patent: Sep. 7, 2010

(54) MAGNETIC MEMORY SYSTEM USING MRAM-SENSOR

(75) Inventors: Friso J. Jedema, Eindhoven (NL); Hans M. B. Boeve, Hechtel-Eksel (BE); Jaap Ruigrok, Asten (NL)

(73) Assignee: NXP B.V., Eindhoven (NL)

( * ) Notice: Subject to any disclaimer, the term of this patent is extended or adjusted under 35 U.S.C. 154(b) by 319 days.

(21) Appl. No.: 11/814,674

(22) PCT Filed: Jan. 19, 2006

(86) PCT No.: PCT/IB2006/050208
§ 371 (c)(1),
(2), (4) Date: Mar. 20, 2008

(87) PCT Pub. No.: WO2006/077553
PCT Pub. Date: Jul. 27, 2006

(65) Prior Publication Data
US 2008/0316801 A1    Dec. 25, 2008

(30) Foreign Application Priority Data
Jan. 24, 2005    (EP)  .................................. 05100427

(51) Int. Cl.
    G11C 11/34    (2006.01)
(52) U.S. Cl. .................. 365/185; 365/171; 365/173
(58) Field of Classification Search .................. 365/158, 365/171, 173
See application file for complete search history.

(56) References Cited

U.S. PATENT DOCUMENTS 5,966,323 A * 10/1999 Chen et al. .................. 365/158

(Continued)

FOREIGN PATENT DOCUMENTS

EP    0982736 A2    3/2000

(Continued)

*Primary Examiner*—Connie C Yoha

(57) ABSTRACT

The invention relates to a Magnetic memory system (1, 20) which comprises an information layer (13) and a sensor (2, 22) for cooperating with the information layer (13). The information layer (13) comprises a pattern of magnetic bits (4a, 4b, 4c, 4d, 24a, 24c, 24d) which constitutes an array of bit locations. A bit magnetic field (3a, 3b, 3c, 3d) at a bit location represents a logical value (LO, L1/2, L1). The sensor (2, 22) comprises a magnetoresistive element (6, 26) comprising a fixed magnetic layer (7) and a free magnetic layer (8). The free magnetic layer (8) has a magnetization axis (10) along which the free magnetic layer retains a free magnetization direction (1 Ib, 1 Ic, 21b, 21c). A first bit magnetic field (3b, 3c) at one of the bit locations represents a first logical value (LO, L1/2, L1) by providing a first resistance value (Rmax, Rmid, Rmin) in the magnetoresistive element (6, 26) due to the free magnetization direction (1 Ic, 1 Ib, 21a, 21c) being substantially parallel to the magnetization axis (10). A second bit magnetic field (3a, 3d) at one of the bit locations represents a second logical value (LO, L1/2, L1) by providing a second resistance value (Rmax, Rmid, Rmin) in the magnetoresistive element (6, 26) due to the free magnetization direction (Ha, 1 Id, 21a, 2Id) having an angle (12a, 12d, 27) with the magnetization axis (10). The second bit magnetic field (3a, 3d) which provides the second resistance value (Rmax, Rmid, Rmin) is not one of the two stable magnetization directions of the free magnetic layer (8) and thus is different from the first resistance value (Rmax, Rmid, Rmin). The magnetization direction of the free magnetic layer (8) of the sensor (2, 22) no longer needs to be set before read-out.

13 Claims, 7 Drawing Sheets

U.S. PATENT DOCUMENTS

Figure 1A:
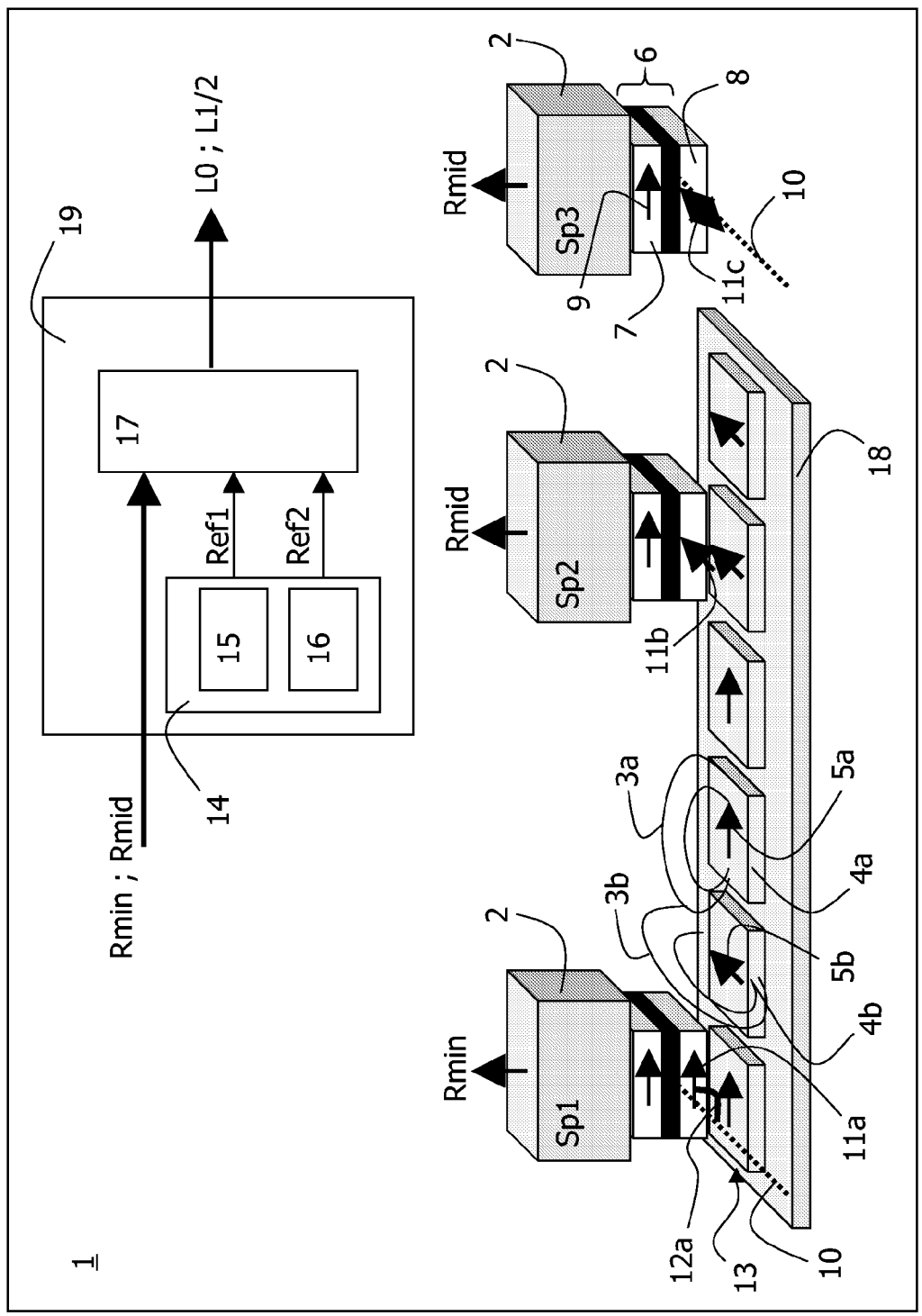

| | | | |
|---|---|---|---|
| 6,215,695 B1 * | 4/2001 | Ikeda | 365/158 |
| 6,483,741 B1 | 11/2002 | Iwasaki et al. | |
| 6,654,278 B1 | 11/2003 | Engel et al. | |
| 6,873,547 B1 * | 3/2005 | Shi et al. | 365/173 |
| 6,999,340 B2 * | 2/2006 | Shimizu | 365/158 |
| 7,038,939 B2 * | 5/2006 | Amano et al. | 365/158 |
| 7,180,773 B2 * | 2/2007 | Okumura et al. | 365/171 |
| 7,321,507 B2 * | 1/2008 | Yang et al. | 365/158 |

FOREIGN PATENT DOCUMENTS

| | | |
|---|---|---|
| WO | 2004032149 A1 | 4/2004 |

* cited by examiner

MAGNETIC MEMORY SYSTEM USING MRAM-SENSOR

The invention relates to a magnetic memory system comprising an information layer and a sensor for cooperating with the information layer, the information layer comprising a pattern of magnetic bits constituting an array of bit locations, a bit magnetic field at a bit location representing a logical value, the bit magnetic field having a bit magnetic field strength and a bit magnetization direction, the sensor comprising a magnetoresistive element comprising a stack of layers including a fixed magnetic layer and a free magnetic layer, the fixed magnetic layer having a fixed magnetization direction, the free magnetic layer having a magnetization axis along which the free magnetic layer retains a free magnetization direction.

The invention further relates to an information carrier and a read circuit.

Several types of Magnetic Memory systems using magnetoresistive elements are known. The magnetoresistive elements typically comprise a stack of layers in which the resistance in the stack depends on the magnetization direction of the magnetic layers. In an MRAM configuration the stack of layers comprises a free magnetic layer, which comprises two stable magnetization directions enabling the magnetoresistive element to store a logical value.

Read only magnetic information systems are, for example, disclosed in WO 2004/032149. In this document a storage device is disclosed comprising an information carrier part and a read-out part. The information carrier part comprises an information plane for cooperating with a read-out part. The read-out part comprises a two-dimensional array of electromagnetic sensor elements. The read-out is done via a resistance measurement which relies on a magnetoresistance phenomenon. In a specific embodiment of the information carrier, the electro-magnetic material which represents a bit at a bit location is constituted by hard magnetic material. The pattern of hard magnetic material is permanently magnetized in an external magnetic field, creating a pattern of magnetized magnetic bits all substantially having the same predetermined magnetic field direction and a magnetic field strength. In a specific embodiment of the sensor, the sensor comprises two ferromagnetic layers having different switching field strengths. The read-out of the sensor is done by measuring the resistance of the sensor while the sensor subsequently generates two magnetic field pulses which have a field strength in between the switching field strengths of the two ferromagnetic layers and which comprise opposite magnetic field directions. The layer with the higher switching field, usually indicated as the fixed magnetic layer, will remain unchanged, while the magnetization of the layer with the lower switching field, usually indicated as the free magnetic layer, will be set by a first magnetic field pulse in a defined direction and then be reversed by a second magnetic field pulse. When the magnetic field of the magnetic bit is present at a specific sensor, the magnetization direction of the free magnetic layer of the specific sensor cannot be reversed during the second magnetic field pulse and thus comprises an inverted magnetization direction compared to a sensor not having a magnetic bit present. The two opposite magnetization directions of the free magnetic layer result in two sensed resistance values: a first resistance value at a first magnetization and a second resistance value (different from the first resistance value) at the reversed magnetization direction. When measuring the resistance of the sensor elements at each of the bit locations, the logical value of each of the bit locations can be determined.

In the known Magnetic ROM storage systems the free magnetic layer in the sensor typically comprises two stable magnetization directions, resulting in the two resistance values in the sensor. At the beginning of the measurement, the free magnetic layer may comprise any of the two stable magnetization directions. To enable a read-out of the sensor, the magnetization direction of the free layer must be set by generating a magnetic field before reading the logical value of a bit location.

It is an object of the invention to provide a storage system wherein the magnetic bits can be read without setting the free magnetic layer.

According to a first aspect of the invention the object is achieved with a magnetic memory system as defined in the opening paragraph, wherein a first bit magnetic field at one of the bit locations represents a first logical value by providing a first resistance value in the magnetoresistive element due to the free magnetization direction being substantially parallel to the magnetization axis, and a second bit magnetic field at one of the bit locations represents a second logical value by providing a second resistance value in the magnetoresistive element due to the free magnetization direction having an angle with the magnetization axis.

The effect of the measures according to the invention is that the second bit magnetic field rotates the free magnetization direction which results in an angle between the free magnetization direction and the magnetization axis. The rotated free magnetization direction combined with the fixed magnetization direction of the fixed magnetic layer provides the second resistance value in the magnetoresistive element, which represents the second logical value. At a bit location which comprises the first bit magnetic field, the free magnetization direction is substantially parallel to the magnetization axis of the free magnetic layer. The free magnetization direction parallel to the magnetization axis combined with the fixed magnetization direction of the fixed magnetic layer provides the first resistance value in the magnetoresistive element, which represents the first logical value. Because the free magnetic layer comprises two stable magnetization directions parallel to the magnetization axis, the first logical value results from any of the two stable magnetization directions. The rotation of the free magnetization direction by the second bit magnetic field enables a distinction between the bit locations with the first bit magnetic field and bit locations with the second bit magnetic field. The magnetization direction which provides the second resistance value is not one of the two stable magnetization directions of the free magnetic layer and thus is different from the first resistance value, omitting the need for setting the magnetization direction of the free magnetic layer before read-out.

In an embodiment of the system, the first bit magnetic field has a first magnetic field strength that is substantially zero. At the bit location where the bit magnetic field is substantially zero, the free magnetic layer of the magnetoresistive element will be in any of the two stable magnetization directions and thus will be undefined. The bit locations which provide the second bit magnetic field to the sensor rotate the free magnetization direction which results in a resistance value in the magnetoresistive element which can be discriminated from any of the two stable magnetization directions of the free magnetization direction. The information layer substantially comprises a pattern of magnetic bits in which the presence or absence of the second bit magnetic field determines the logical value of the bit location. Because the bit magnetic fields present at the information layer all substantially have the same magnetization direction the manufacturing of the information layer is relatively easy.

In an embodiment of the system, the second bit magnetic field has a second magnetization direction that is substantially perpendicular to the magnetization axis. The free magnetization direction is rotated by the second bit magnetic field to be substantially parallel to the second bit magnetic field and thus substantially perpendicular to the magnetization axis. In a preferred embodiment the fixed magnetization direction is perpendicular to the magnetization axis. A benefit of this embodiment is that the two stable magnetization directions of the free magnetic layer both are perpendicular to the fixed magnetization direction and thus both substantially provide the same resistance value in the magnetoresistive element. Because the two stable magnetization directions of the free magnetic layer are represented by a single resistance value, the presence of the first or the second bit magnetic field at one of the bit locations can be identified by, for example, using a single reference value.

In an embodiment of the system, a further bit magnetic field at one of the bit location represents a further logical value by providing a further resistance value in the magnetoresistive element due to the free magnetization direction having a further angle with the magnetization axis, the further angle being different from the angle causing the second logical value. The further bit magnetic field provides the further logical value which is different from the first logical value and the second logical value. A benefit of this embodiment is that the information stored in the pattern of magnetic bits represents a tertiary system in contrast with a binary system. The tertiary system as shown in this embodiment comprises three logical values: the first logical value, the second logical value and the further logical value.

In an embodiment of the system, the system comprises an information carrier comprising an information layer which comprises a pattern of magnetic bits constituting an array of bit locations, a bit magnetic field at a bit location representing a logical value, the bit magnetic field having a bit magnetic field strength and a bit magnetization direction, wherein a first bit magnetic field at one of the bit locations represents a first logical value by providing a first resistance value in the magnetoresistive element due to the free magnetization direction being substantially parallel to the magnetization axis, a second bit magnetic field at one of the bit locations represents a second logical value by providing a second resistance value in the magnetoresistive element due to the free magnetization direction having an angle with the magnetization axis, and a further bit magnetic field at one of the bit locations represents a further logical value by providing a further resistance value in the magnetoresistive element due to the free magnetization direction having a further angle with the magnetization axis, the further angle being different from the angle causing the second logical value. The information carrier in this embodiment has a pattern of magnetic bits which represents a tertiary system in contrast with a binary system. The tertiary system comprises three logical values: the first logical value, the second logical value and the further logical value.

In an embodiment of the system, the system comprises a read circuit for reading a logical value from a sensor comprising a magnetoresistive element, wherein the read circuit comprises a reference circuit for providing at least two reference levels based on reference magnetoresistive elements and wherein the logical value is read by comparing a resistance value in the magnetoresistive element with the at least two reference levels. A benefit of this embodiment is that it enables a distinction in a system in which the free magnetization direction is undefined and may have any of the two stable magnetization directions. By comparing the resistance value with at least two reference levels, the resistance value caused by the second bit magnetic field can be distinguished from the two possible resistance values of the free magnetization direction parallel to the magnetization axis. A further benefit of this embodiment is that it enables the reading of, for example, a tertiary system in which three resistance values must be distinguished.

In an embodiment of the system, the fixed magnetization direction is substantially parallel to the magnetization axis of the free magnetic layer. When the free magnetization direction is pointing in the same direction as the fixed magnetization direction, the sensed resistance value is typically a minimum resistance value, for example, representing the logical value "0". When the free magnetization direction is pointing in the opposite direction compared to the fixed magnetization direction, the sensed resistance value is typically a maximum resistance value, for example, representing the logical value "1". The bit magnetic field rotates the free magnetization direction away from the magnetization axis of the free magnetic layer which results in a sensed resistance value which is an intermediate resistance value between the maximum resistance value and the minimum resistance value, for example, representing a logical value "½".

In an embodiment of the system, the fixed magnetization direction is substantially perpendicular to the magnetization axis of the free magnetic layer. Any of the two possible stable magnetization directions of the free magnetic layer provide substantially the same resistance value in the magnetoresistive element, being a resistance value substantially halfway between the maximum resistance value and the minimum resistance value. The second bit magnetic field, for example, rotates the free magnetization direction parallel to the fixed magnetization direction, for example representing the logical value "0" or, for example rotates the free magnetization layer opposite to the fixed magnetization direction, for example, representing the logical value "1". A benefit of this embodiment is that the two stable magnetization directions of the free layer substantially provide a single resistance value and thus a single reference value is sufficient to distinguish between the presence of the first bit magnetic field and the presence of the second bit magnetic field.

In an embodiment of the system, the system comprises a reference circuit, the reference circuit providing at least one reference level based on reference magnetoresistive elements for distinguishing the first resistance value from the second resistance value. The resistance value in the magnetoresistive element may, for example, be influenced by temperature variations and/or aging effects. Because the reference levels are based on reference magnetoresistive elements, temperature variations and aging effects which influence the magnetoresistive elements will also influence the reference levels in a similar manner which enables an automatic compensation of the reference levels for, for example, temperature variations and/or aging effects.

In an embodiment of the system, the reference circuit provides at least a second reference level based on reference magnetoresistive elements for distinguishing resistance values being arranged between two reference levels. A benefit of this embodiment is that it enables read-out in a system in which the sensed resistance comprises three different resistance values. The three different resistance values may result from three bit magnetic fields, each having a resistance value or from two bit magnetic fields in which one of the bit magnetic fields comprises two stable magnetization directions which result in two resistance values.

In an embodiment of the system, the bit magnetic field at one of the bit locations is provided by the presence or absence of magnetized magnetic material at the one of the bit locations. The magnetic material may comprise the first bit magnetic field, the second bit magnetic field or the further magnetic field. The embodiment in which the first magnetic field is substantially zero represents, for example, the absence of magnetic material.

In an embodiment of the system, the sensor comprises a two dimensional array of magnetoresistive elements. A benefit of this embodiment is that the array of magnetoresistive elements can, for example, be read at the same time which increases the data exchange rate. Another benefit of this embodiment is that the array of bits which correspond to the two dimensions array of magnetoresistive elements can be read without movement of the sensor. This, for example, reduces the sensitivity of the system to shocks.

These and other aspects of the invention are apparent from and will be elucidated with reference to the embodiments described hereinafter.

Figure 1B:
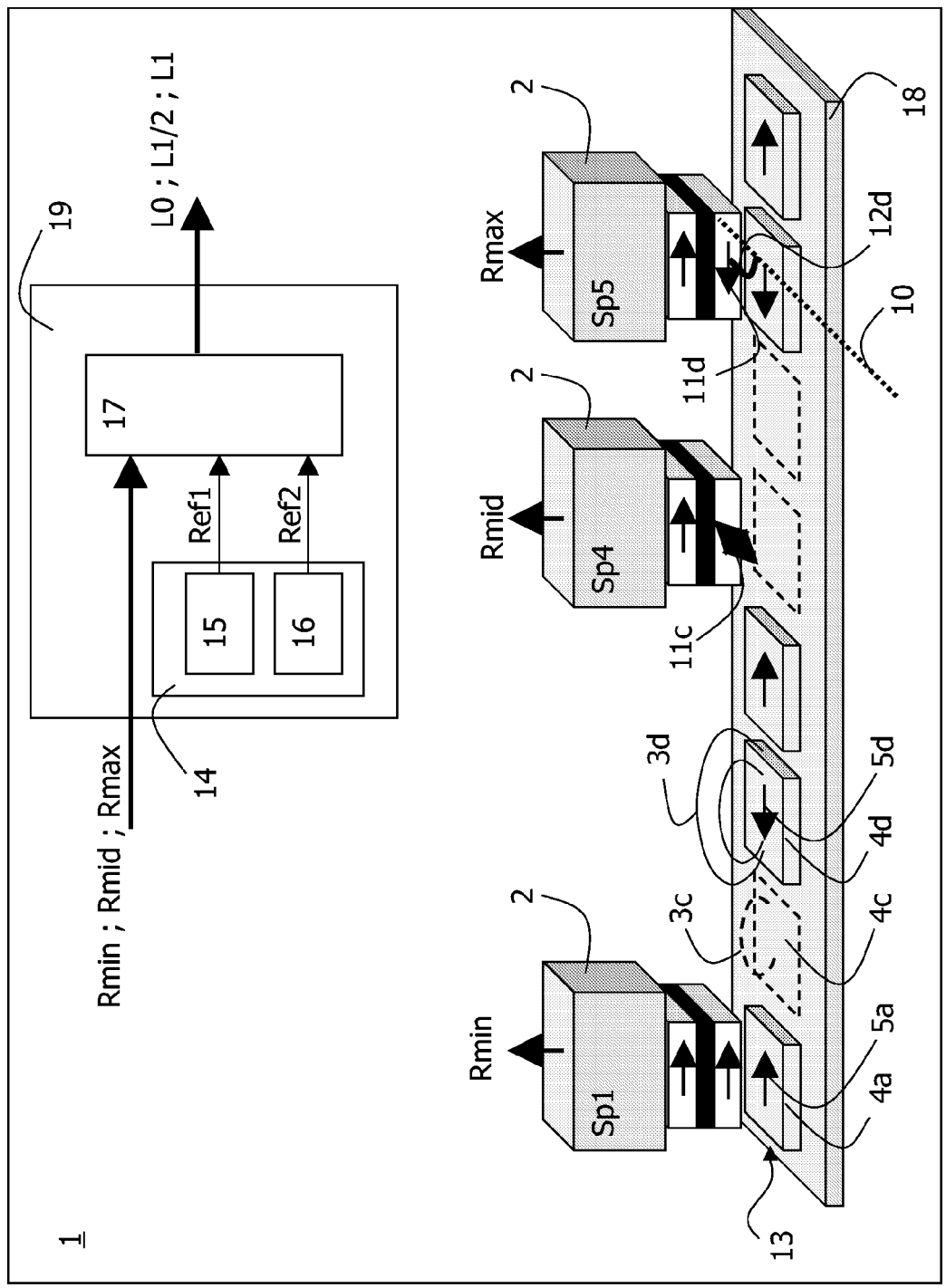
Figure 2:
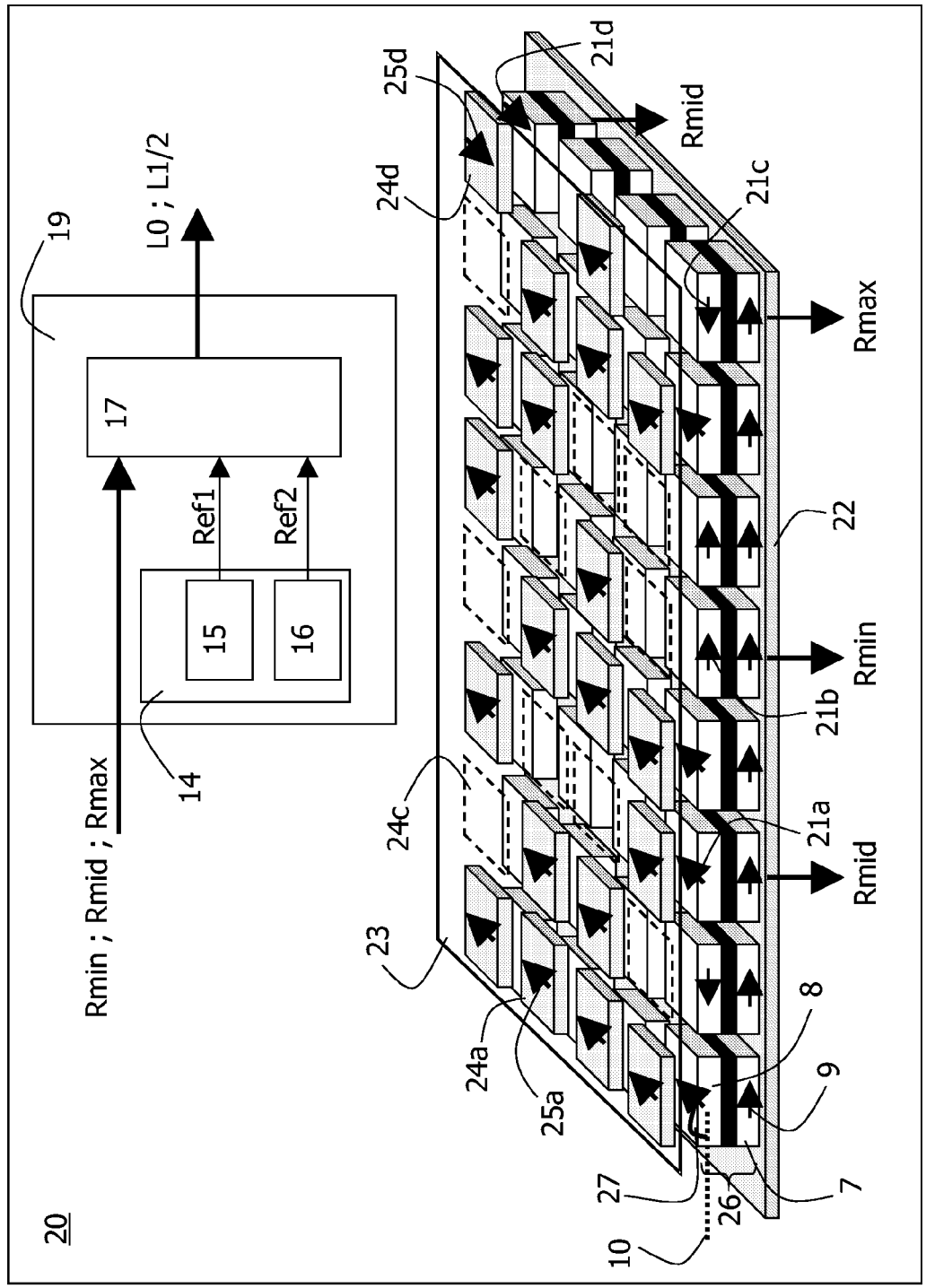
Figure 3:
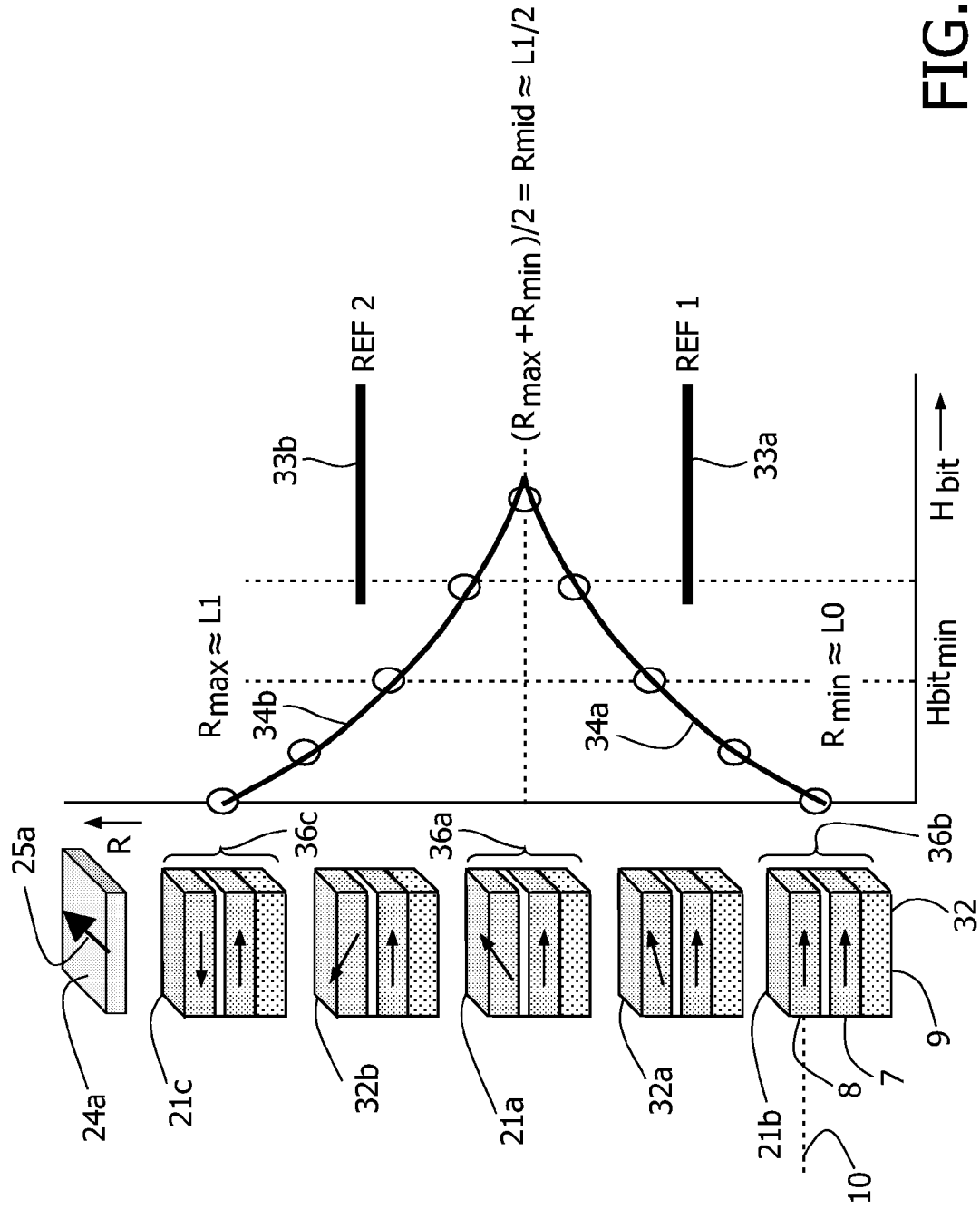
Figure 4A:
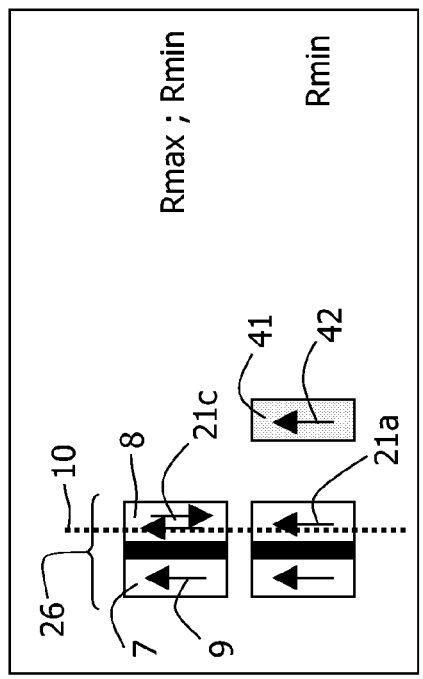
Figure 4C:
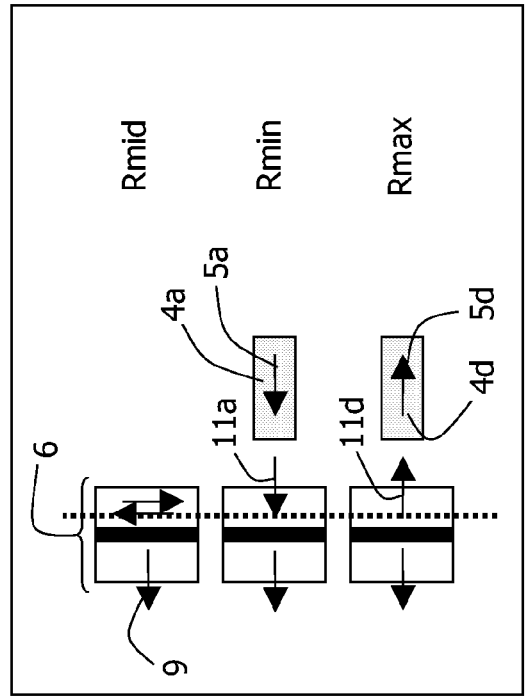
Figure 4B:
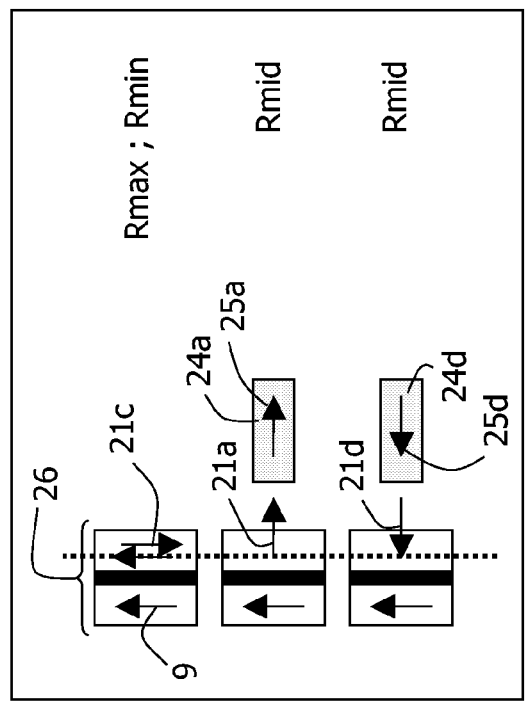
Figure 5B:
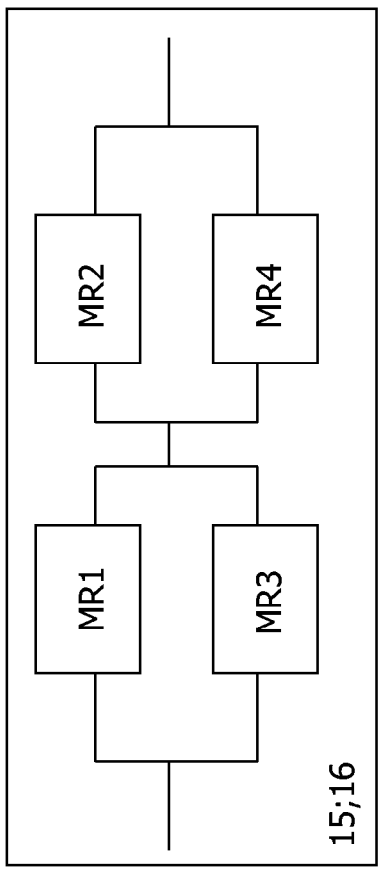
Figure 5A:
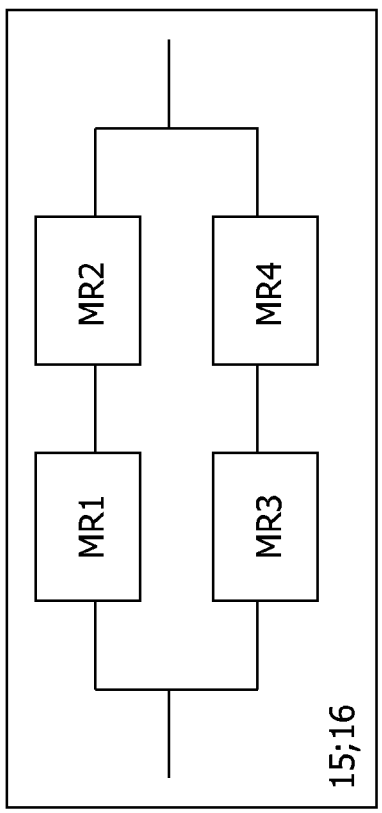
Figure 5C:
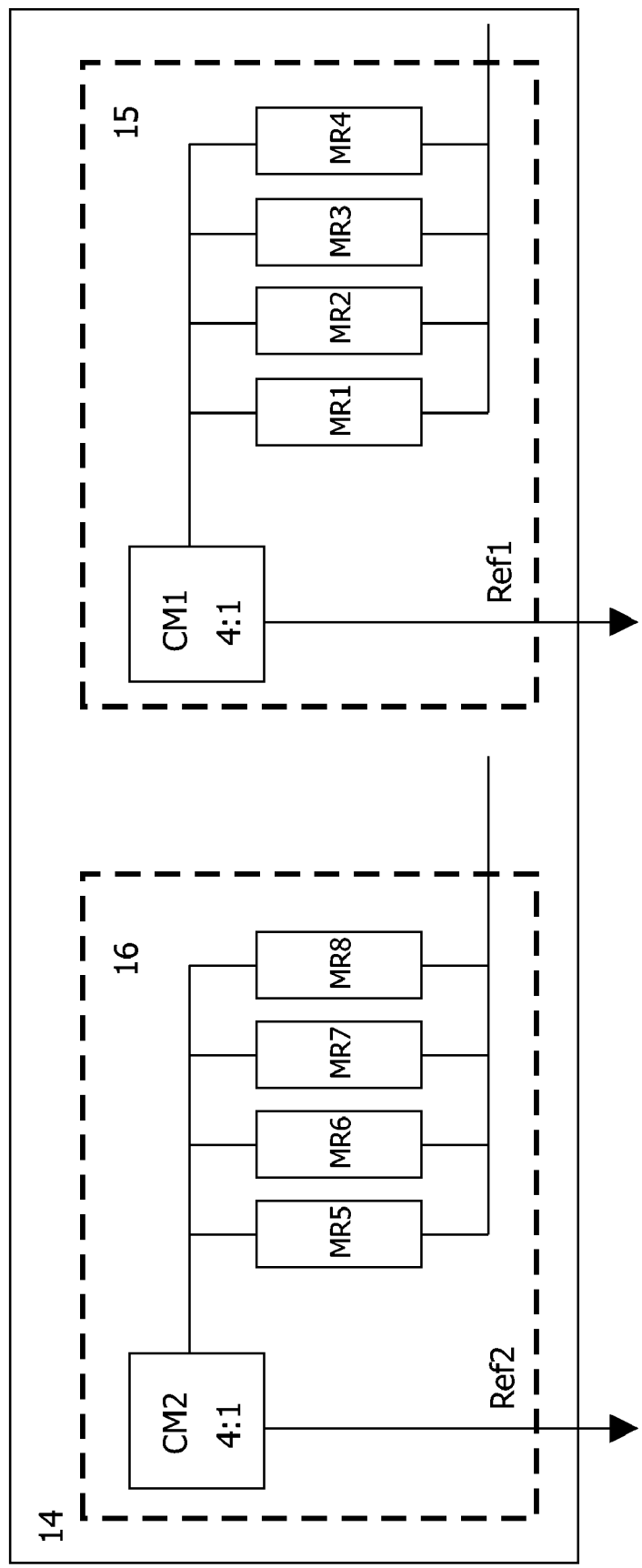

In the drawings:

FIGS. 1a-b show an embodiment according to the invention which has a one dimensional array of magnetic bits, FIG. 2 shows an embodiment according to the invention which has a two dimensional array of magnetic bits, FIG. 3 shows the sensed resistance versus bit magnetic field strength wherein the bit magnetic field is perpendicular to the magnetization axis of the free magnetic layer, FIGS. 4a-c show a summary of the preferred configurations of the magnetization directions of the bit magnetic fields and the magnetization directions in the magnetoresistive element, and FIGS. 5a-c show some embodiments of reference circuits according to the invention.

FIG. 1 shows an embodiment 1 according to the invention which has a one dimensional array of magnetic bits 4a, 4b, 4c, 4d.

The embodiment shown in FIG. 1a has a one dimensional array of magnetic bits 4a, 4b wherein each bit magnetic field 3a, 3b has a bit magnetization direction 5a, 5b. The magnetic bits 4a, 4b are located in an information layer 13 which is part of an information carrier 18. The information carrier 18 may be an integrated information carrier 18 in the system 1 or may be a removable information carrier 18. The FIG. 1a also shows a simplified representation of a sensor 2 which is shown to interact with the information layer 13 at three different locations Sp1, Sp2, Sp3. The sensor 2 comprises a magnetoresistive element 6 which has a stack of layers. The stack of layers includes a fixed magnetic layer 7 and a free magnetic layer 8. The fixed magnetic layer 7 has a fixed magnetization direction 9 which is considered not to be influenced by a nearby magnetic field. The free magnetic layer 8 has a magnetization axis 10 along which the free magnetic layer 8 retains two stable magnetization directions 11c. In the embodiment shown in FIG. 1 the magnetization axis 10 of the free magnetic layer 8 is perpendicular to the fixed magnetization direction 9.

At the first sensor position Sp1, the sensor 2 interacts with a magnetic bit 4a which comprises a bit magnetic field 3a, also indicated as second bit magnetic field 3a. The second bit magnetic field 3a has a second bit magnetization direction 5a which is perpendicular to the magnetization axis 10 and which is parallel to the fixed magnetization direction 9. The presence of the second bit magnetization direction 5a rotates the free magnetization direction from one of the stable magnetization direction 11c to form an angle 12a with the magnetization axis 10. When the magnetic field strength of the second bit magnetic field 3a is sufficient, the second bit magnetic field 3a rotates the free magnetization direction 11c to the magnetization direction 11a where the angle 12a between the rotated free magnetization direction 11a and the magnetization axis 10 is substantially 90 degrees. In the sensor 2 at the first sensor position Sp1 the free magnetization direction 11a points in the same direction as the fixed magnetization direction 9 which results in a low resistance value Rmin in the magnetoresistive element 6.

At the second sensor position Sp2, the sensor 2 interacts with a magnetic bit 4b which comprises a bit magnetic field 3b, also indicated as first bit magnetic field 3b. The first bit magnetic field 3b has a first bit magnetization direction 5b which is parallel to the magnetization axis 10 and which is (in this embodiment) perpendicular to the fixed magnetization direction 9. When the first bit magnetic field strength is sufficient, the first bit magnetic field 3b forces the free magnetization direction 11c into the stable position 11b. In the sensor 2 at the second sensor position Sp2 the free magnetization direction 11b is perpendicular to the fixed magnetization direction 9 which results in an intermediate resistance value Rmid in the magnetoresistive element 6.

At the third sensor position Sp3, the sensor 2 does not interact with a magnetic bit from the information layer 13. The free magnetization direction 11c can be in any of the two stable magnetization directions parallel to the magnetization axis 10. In each of the two stable magnetization directions the free magnetization direction 11c will be perpendicular to the fixed magnetization direction 9. Identical to the sensor 2 at the second sensor position Sp2, the resistance value in the magnetoresistive element 6 is the intermediate resistance value Rmid.

The sensor 2 provides the sensed resistance value Rmin, Rmid to the read circuit 19 which comprises a reference circuit 14. The reference circuit 14 provides two reference levels Ref1, Ref2 from reference generators 15, 16 which comprise reference magnetoresistive elements. The read circuit further comprises a comparator circuit 17 which compares the sensed resistance value Rmin, Rmid with at least one of the reference levels Ref1, Ref2. The comparator circuit 17 assigns the logical value L0, L1/2 to the resistance value provided by the magnetoresistive element 6 due to the magnetic bits 4a, 4b of the information layer 13.

FIG. 1b shows an embodiment in which the magnetic field strength of the first bit magnetic field 3c is substantially zero. Furthermore, FIG. 1b comprises, next to the second bit magnetic field 3b also a further bit magnetic field 3d having a further magnetization direction 5d which is opposite to the second magnetization direction 5a.

At the first sensor position Sp1, the sensor 2 comprises a low resistance value Rmin as indicated in FIG. 1a.

At the fourth sensor position Sp4, the sensor 2 interacts with a bit location 4c not having a magnetic bit present. There might be some residual or stray magnetic field 3c present (of which the magnetization direction can in principle be in any direction), but the field at the bit location 4c is insufficient to change the magnetization direction 11c of the sensor 2. The free magnetization direction 11c of the sensor at the fourth sensor position Sp4 is undetermined and can be either of the two stable magnetization directions of the free magnetic layer 8. Because both the stable magnetization directions 11c of the free magnetic layer 8 are perpendicular to the magnetization axis 10, the resistance value in the magnetoresistive element 6 is always the intermediate resistance value Rmid.

At the fifth sensor position Sp5, the sensor 2 interacts with a magnetic bit 4d which comprises a further bit magnetic field 3d which has a further bit magnetization direction 5d. The further bit magnetization direction 5d is perpendicular to the magnetization axis 10 and points in the opposite direction compared to the second bit magnetization direction 5a. The presence of the further bit magnetic field 3d rotates the free magnetization direction from one of the stable magnetization direction 11c to form an angle 12d with the magnetization axis 10. When the magnetic field strength of the further bit magnetic field 3d is sufficient, the further bit magnetic field 3d rotates the free magnetization direction 11c to the magnetization direction 11d where the angle 12d between the rotated free magnetization direction 11d and the magnetization axis 10 is substantially 90 degrees. In the sensor 2 at the fifth sensor positions Sp5 the free magnetization direction 11d points in the opposite direction compared to the fixed magnetization direction 9 which results in a high resistance value Rmax in the magnetoresistive element 6.

The sensor 2 provides the sensed resistance value Rmax, Rmid, Rmin at each of the sensor positions Sp1, Sp4, Sp5 to the read circuit 19 where the comparator circuit 17 assigns the logical value L0, L1/2, L1 to the resistance value provided by the magnetoresistive element 6 due to the magnetic bit 4a, 4d or due to the bit location 4c of the information layer 13.

In contrast with the system shown in FIG. 1a, which substantially describes a binary system having two logical values L0, L1/2, the system shown in FIG. 1b describes a tertiary system, having three logical values: L0, L1/2, L1. To be able to discriminate between the three logical values L0, L1/2, L1, the read circuit 19 must have two reference levels Ref1, Ref2 as will be shown in FIG. 3.

FIG. 2 shows an embodiment 20 according to the invention which has an information carrier 23 which comprises a two dimensional pattern of magnetic bits 24a, 24c, 24d. Also in this embodiment, the information carrier 23 may be an integrated information carrier 23 in the system 20 or may be a removable information carrier 23. Each magnetic bit 24a, 24c, 24d provides a second bit magnetic field (not shown) having a second bit magnetization direction 25a, 25d. The magnetic field strength of the first bit magnetic field is substantially zero, which is indicated by a bit location 24c without a magnetic bit present. The system 20 shown in FIG. 2 further comprises a sensor 22 which comprises a two dimensional array of magnetoresistive elements 26. Each magnetoresistive element 26 comprises a stack of layers having a fixed magnetic layer 7 and a free magnetic layer 8, identical to the magnetoresistive element 6 in FIGS. 1a and 1b. The difference between the magnetoresistive element 6 shown in FIGS. 1a and 1b and the magnetoresistive element 26 shown in FIG. 2 is that the magnetization axis 10 of the free magnetic layer 8 in the magnetoresistive element 26 is parallel to the fixed magnetization direction 9.

When a second bit magnetic field having a second bit magnetization direction 25a is present at the magnetoresistive element 26, the free magnetization direction is rotated from one of the two stable magnetization directions 21b, 21c to a magnetization direction 21a which substantially points in the same direction as the second bit magnetization direction 25a. The rotated free magnetization direction 21a is arranged perpendicular to the fixed magnetization direction 9 which results in an intermediate resistance value Rmid in the magnetoresistive element 26.

At the bit location 24c where no magnetic bit is present at the magnetoresistive element 26, the free magnetization direction can be any of the two stable magnetization directions 21b, 21c. When the free magnetization direction 21b points in the same direction as the fixed magnetization direction 9, the magnetoresistive element 26 comprises a low resistance value Rmin. When the free magnetization direction 21c points in the opposite direction compared to the fixed magnetization direction 9, the magnetoresistive element 26 comprises a high resistance value Rmax. The free magnetization direction 21b, 21c at the bit locations 24c may randomly be any of the two stable magnetization directions 21b, 21c and thus is undefined.

In the embodiment 20 shown in FIG. 2 again the read circuit 19 is present which comprises the reference circuit 14. The reference circuit 14 provides two reference levels Ref1, Ref2 based on reference magnetoresistive elements. The comparator circuit 17 assigns the logical value L0, L1/2 to the resistance value provided by the magnetoresistive element 26 due to the magnetic bit 24a or due to the bit location 24c of the information layer 13.

To enable the assignment of the logical value L0, L1/2 to the sensed resistance values Rmax, Rmid, Rmin the reference circuit 14 requires both reference levels Ref1, Ref2. Because the free magnetization direction at the bit location 24c may randomly be any of the two stable magnetization direction 21b, 21c (being Rmin, Rmax), the resistance value to which the comparator circuit 17 must assign the logical value L0 is both the low resistance value Rmin and the high resistance value Rmax. The resistance value to which the comparator circuit 17 must assign the logical value L1/2 is the intermediate resistance value Rmid. When the two reference levels Ref1, Ref2 are, for example, resistance values, a first reference resistance value Ref1 must be between the low resistance value Rmin and the intermediate resistance value Rmid and a second reference resistance value Ref2 must be between the high resistance value Rmax and the intermediate resistance value Rmid. This is shown in more detail in FIG. 3.

The information carrier 22 may comprise a further magnetic bit 24d which has a further bit magnetization direction 25d. The further bit magnetization direction 25d is perpendicular to the magnetization axis 10 and points in the opposite direction compared to the second bit magnetization direction 25a. The presence of the further bit magnetic field rotates the free magnetization direction from one of the stable magnetization direction 21b, 21c to the free magnetization direction 21d. The free magnetization direction 21d is arranged perpendicular to the fixed magnetization direction 9 which results in the intermediate resistance value Rmid which is identical to the intermediate resistance value Rmid which results from the free magnetization direction 21b. The comparator assigns, in the described configuration, the same logical value L1/2 to the bit location which comprises the further magnetization direction 25d. To enable a distinction between the second magnetic bit 24a and the further magnetic bit 24d, for example, the rotation of the free magnetization directions must be altered, for example, using different field strength or changing the orientation of the second bit magnetization direction 25a and the further bit magnetization direction 25d.

FIG. 3 shows the sensed resistance R in the magnetoresistive element 36 versus the bit magnetic field strength Hbit wherein the bit magnetization direction 25a is perpendicular to the magnetization axis 10. In FIG. 3 five identical magnetoresistive elements 36 are shown which each comprise a stack of layers having a fixed magnetic layer 7 and a free magnetic layer 8, identical to the magnetoresistive elements 6 and 26 in FIGS. 1a, 1b and 2. The magnetoresistive elements shown in FIG. 3 comprise a layer 32 which typically is a stabilizing layer for stabilizing the fixed magnetization direction 9 in the fixed magnetic layer 7. This layer comprises, for example, anti-ferromagnetic material which is magnetically coupled to the material in the fixed magnetic layer 7. The magnetization axis 10 of the free magnetic layers 8 in the magnetoresistive element 36 is parallel to the fixed magnetization direction 9. The magnetoresistive elements 36b and 36c show the two stable magnetization directions 21b, 21c of the free magnetic layer 8. The free magnetization direction 21b of the magnetoresistive element 36b points in the same direction as the fixed magnetization direction 9, which results in a low resistance value Rmin. The free magnetization direction 21c of the magnetoresistive element 36c points in the opposite direction compared to the fixed magnetization direction 9, which results in a high resistance value Rmax. When a bit magnetic field is absent or is below a minimum bit magnetic field $Hbit_{min}$, the free magnetization direction of the magnetoresistive element 36 can be in either stable magnetization direction 21b, 21c. The magnetoresistive element 36a shows a rotated free magnetization direction 21a which is perpendicular to the magnetic axis 10, which results in an intermediate resistance value Rmid. The rotated free magnetization direction 32a results from the interaction between the magnetoresistive element 36b and a magnetic bit 24a which has a magnetic field strength Hbit close to the minimum bit magnetic field strength $Hbit_{min}$. The rotated free magnetization direction 32b results from the interaction between the magnetoresistive element 36c and a magnetic bit 24a which has a magnetic field strength Hbit close to the minimum bit magnetic field strength $Hbit_{min}$. The lines 34a and 34b in the graph indicate the change in resistance in the magnetoresistive element 36 when the bit magnetic field strength of the magnetic bit 24a is increased. The reference resistance levels Ref1, Ref2 are indicated with the reference lines 33a and 33b.

The graph shows that the resistance R in the magnetoresistive element 36 changes when the bit magnetic field strength increases. Furthermore, the graph shows that the resistance change must cross a reference level Ref1, Ref2 to discriminate, for example, the maximum resistance value Rmax from the intermediate resistance value Rmid. To enable the crossing of the reference level Ref1, Ref2, a minimum magnetic field strength $Hbit_{min}$ must be present at the magnetic bit 24a. When the different resistance levels can be discriminate by, for example, a comparator circuit 17 (FIGS. 1 and 2), the comparator circuit 17 (FIGS. 1 and 2) can assign logical values L0, L1/2, L1 to the sensed resistance values as is indicated in FIG. 3. In the shown configuration of the magnetoresistive element 36 both the maximum resistance value Rmax and the minimum resistance value Rmin represent the same state, being one without bit magnetic field or with a very weak bit magnetic field (for example stray fields). The comparator circuit 17 may then, for example, assign identical logical values, for example, L0 to both the maximum resistance value Rmax and the minimum resistance value Rmin.

FIG. 4 shows a summary of the preferred configurations of the magnetization directions as known from the prior art and as shown in FIGS. 1 and 2.

FIG. 4a shows the configuration of the prior art in which the fixed magnetization direction 9 and the bit magnetization direction 42 both are parallel to the magnetization axis 10 of the magnetoresistive element 26. The magnetoresistive element 26 is identical to the magnetoresistive element 26 introduced in FIG. 2. The state of the magnetoresistive element 26, when no magnetic bit is present, is undefined and may comprise either of the two stable magnetization directions 21c of the free magnetic layer 8. When a magnetic bit 41 is at the magnetoresistive element 26 (the bit magnetic field being sufficiently strong), the free magnetization direction 21a will point in the same direction as the bit magnetization direction 42. However, due to the undefined state of the magnetoresistive element 26 when no magnetic bit is present, the resistance value Rmax, Rmin is not a unique parameter for identifying the presence of a magnetic bit. This illustrates the need for setting the free magnetic layer 8 before reading.

FIG. 4b shows the configuration as is used in FIG. 2. Again, the state of the magnetoresistive element 26, when no magnetic bit is present, is undefined and may comprise either of the two stable magnetization directions 21c of the free magnetic layer 8. However the bit magnetization direction 25a, 25d of the magnetic bits 24a, 24d are perpendicular to the magnetization axis 10. When the magnetic field strength of the magnetic bits is sufficient, the free magnetization direction 21a, 21d will be rotated by the bit magnetic field which results in the intermediate resistance value Rmid. The resistance value Rmid with a magnetic bit 24a, 24d present can be discriminated from the resistance value Rmax, Rmin without a magnetic bit present, which clearly omits the need for setting the free magnetic layer before reading.

FIG. 4c shows the configuration as used in FIG. 1 in which the fixed magnetization direction 9 is perpendicular to the magnetization axis 10. In this embodiment the state of the magnetoresistive element 6, when no magnetic bit is present, is defined, being the intermediate resistance value Rmid. When a magnetic bit 4a, 4d is applied (having sufficient magnetic field strength) which has a magnetization direction perpendicular to the magnetization axis 10, the free magnetization direction 11a, 11d will rotate and point in the same direction as the bit magnetization direction 5a, 5d of the magnetic bit 4a, 4d. The resistance value will then be either the maximum resistance value Rmax when the rotated free magnetization direction 11d is pointing in the opposite direction compared to the fixed magnetization direction 9 or the resistance value will be the minimum resistance value Rmin when the rotated free magnetization direction 11a is pointing in the same direction as the fixed magnetization direction 9.

A benefit of this embodiment is that it can distinguish between two magnetic bits 4a, 4d with opposite magnetization directions 5a, 5d enabling a tertiary system which comprises three logical values.

FIG. 5 shows some embodiments of reference generators 15,16 according to the invention. FIGS. 5a and 5b show voltage reference generators 15, 16 which each comprise 4 reference magnetoresistive elements MR1, MR2, MR3, MR4. FIG. 5c shows a current comparator scheme in which a current mirror CM1, CM2 is used to provide the reference levels Ref1, Ref2.

Voltage reference generators are known from U.S. Pat. No. 6,445,612. In this document four reference magnetoresistive elements are used to provide a midpoint reference for MRAM memory cells in a configuration comparable to the configurations shown in FIGS. 5a and 5b.

FIG. 5a shows four reference magnetoresistive elements MR1, MR2, MR3, MR4 where a first reference magnetoresistive element MR1 connected in series with a second reference magnetoresistive element MR2 is connected parallel to a third reference magnetoresistive element MR3 connected in series with a fourth reference magnetoresistive element MR4. The reference magnetoresistive elements MR1, MR2, MR3, MR4 can be programmed in such a manner that they either represent a resistance value between the maximum resistance value Rmax and the intermediate resistance value Rmid or represent a resistance value between the minimum resistance value Rmin and the intermediate resistance value Rmid. For example, in a configuration in which one of the reference magnetoresistive elements represents a maximum resistance value Rmax and the remaining reference magnetoresistive elements represent a minimum resistance value Rmin, the complete circuit shown in FIG. 5a represents a resistance value close to Rmin plus 25% of (Rmax−Rmin). This configuration may, for example, be used as first reference level Ref1 in the reference circuit 14 (see FIGS. 1 and 2). For example, in a configuration in which one of the reference magnetoresistive elements represents a minimum resistance value Rmin and the remaining reference magnetoresistive elements represent a maximum resistance value Rmax, the complete circuit shown in FIG. 5a represents a resistance value close to Rmin plus 75% of (Rmax−Rmin). This configuration may, for example, be used as second reference level Ref2 in the reference circuit 14.

FIG. 5b shows four reference magnetoresistive elements MR1, MR2, MR3, MR4 where the first reference magnetoresistive element MR1 connected parallel to the third reference magnetoresistive element MR3 is connected in series with the second reference magnetoresistive element MR2 connected parallel to the fourth reference magnetoresistive element. Also in this configuration, the magnetoresistive elements MR1, MR2, MR3, MR4 can be programmed in such a manner that they either represent a resistance value between the maximum resistance value Rmax and the intermediate resistance value Rmid or represent a resistance value between the minimum resistance value Rmin and the intermediate resistance value Rmid. For example, in a configuration in which one of the reference magnetoresistive elements represents a maximum resistance value Rmax and the remaining reference magnetoresistive elements represent a minimum resistance value Rmin, the complete circuit shown in FIG. 5a represents a resistance value of Rmin plus 20% of (Rmax−Rmin). Also this configuration may, for example, be used as first reference level Ref1 in the reference circuit 14 (see FIGS. 1 and 2). For example, in a configuration in which one of the reference magnetoresistive elements represents a minimum resistance value Rmin and the remaining reference magnetoresistive elements represent a maximum resistance value Rmax, the complete circuit shown in FIG. 5a represents a resistance value of Rmin plus 70% of (Rmax−Rmin). This configuration may, for example, be used as second reference level Ref2 in the reference circuit 14.

FIG. 5c shows a current comparator scheme. Current comparator circuits are known from U.S. Pat. No. 6,621,729. In this document a current comparator circuit is shown using two reference magnetoresistive elements to provide a midpoint reference for MRAM memory cells in a configuration comparable to the configurations shown in FIG. 5c.

A reference circuit 14 shown in FIG. 5c comprises two reference generators 15, 16 for generating the two reference levels Ref1, Ref2. The reference generators 15, 16 both comprise a parallel arrangement of four reference magnetoresistive element MR1 to MR8 and a current mirror CM1, CM2 with a current ratio of 4:1 to scale the current back to a reference current. This enables a comparison between the read current of the magnetoresistive element and the reference current. The reference magnetoresistive elements MR1 to MR8 can be programmed in such a manner that, for example, the first current mirror CM1 represents a current for distinguishing between the maximum resistance value Rmax and the intermediate resistance value Rmid and that, for example, a second current mirror CM2 represents a current for distinguishing between the minimum resistance value Rmin and the intermediate resistance value Rmid. This can, for example, be achieved when one of the reference magnetoresistive elements of the first current monitor CM1 represents a maximum resistance value Rmax and the remaining reference magnetoresistive elements connected to the first current monitor CM1 represent a minimum resistance value Rmin and when one of reference magnetoresistive elements of the second current monitor CM2 represents a minimum resistance value Rmin and the remaining reference magnetoresistive elements connected to the second current monitor CM2 represent a maximum resistance value Rmax. These configurations may, for example, be used as the first reference level Ref1 and the second reference level Ref2 in the reference circuit 14.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. Magnetic memory system comprising an information layer and a sensor for cooperating with the information layer, the information layer comprising a pattern of magnetic bits constituting an array of bit locations, a bit magnetic field at a bit location representing a logical value, the bit magnetic field having a bit magnetic field strength and a bit magnetization direction the sensor comprising a magnetoresistive element comprising a stack of layers including a fixed magnetic layer and a free magnetic layer, the fixed magnetic layer having a fixed magnetization direction, the free magnetic layer having a magnetization axis along which the free magnetic layer retains a free magnetization direction in one of two stable magnetization directions, wherein a first bit magnetic field, at one of the bit locations represents a first logical value by providing a first resistance value in the magnetoresistive element due to the free magnetization direction being substantially parallel to the magnetization axis, and a second bit magnetic field at one of the bit locations represents a second logical value by providing a second resistance value in the magnetoresistive element due to the free magnetization direction being non-parallel to the magnetization axis.

2. System as claimed in claim 1, wherein the first bit magnetic field has a first magnetic field strength that is substantially zero.

3. System as claimed in claim 1, wherein the second bit magnetic field has a second magnetization direction that is substantially perpendicular to the magnetization axis.

4. System as claimed in claim 1, wherein a further bit magnetic field at one of the bit locations represents a further logical value by providing a further resistance value in the magnetoresistive element due to the free magnetization direction being non-parallel to the magnetization axis and being non-parallel to the free magnetization direction due to the second bit magnetic field.

5. System as claimed in claim 1, wherein the fixed magnetization direction is substantially parallel to the magnetization axis of the free magnetic layer.

6. System as claimed in claim 1, wherein the fixed magnetization direction is substantially perpendicular to the magnetization axis of the free magnetic layer.

7. System as claimed in claim 1, wherein the system comprises a reference circuit, the reference circuit providing at least one reference level based on reference magnetoresistive elements for distinguishing the first resistance value from the second resistance value.

8. System as claimed in claim 7, wherein the reference circuit provides at least a second reference level based on reference magnetoresistive elements for distinguishing resistance values being arranged between two reference levels.

9. System as claimed in claim 1, wherein the bit magnetic field at one of the bit locations is provided by the presence or absence of magnetized magnetic material at the one of the bit locations.

10. System as claimed in claim 1, wherein the sensor comprises a two dimensional array of magnetoresistive elements.

11. Information carrier for use in the system of claim 1, the information carrier comprising an information layer which comprises a pattern of magnetic bits constituting an array of bit locations, a bit magnetic field at a bit location representing a logical value, the bit magnetic field having a bit magnetic field strength and a bit magnetization direction, wherein a first bit magnetic field at one of the bit locations represents a first logical value by providing a first resistance value in the magnetoresistive element due to the free magnetization direction being substantially parallel to the magnetization axis, and a second bit magnetic field at one of the bit locations represents a second logical value by providing a second resistance value in the magnetoresistive element due to the free magnetization direction being non-parallel to the magnetization axis, and a further bit magnetic field at one of the bit location represents a further logical value by providing a further resistance value in the magnetoresistive element due to the free magnetization being non-parallel to the magnetization axis and being non-parallel to the free magnetization direction due to the second bit magnetic field.

12. Read circuit for use in the system of claim 1 for reading a logical value from a sensor, comprising a magnetoresistive element, wherein the read circuit comprises a reference circuit for providing at least two reference levels based on reference magnetoresistive elements and wherein the logical value is read by comparing a resistance value in the magnetoresistive element with the at least two reference levels.

13. Read circuit as claimed in claim 12 having two reference levels, wherein a reference resistance range is arranged between the two reference levels and wherein one logical value is read when the resistance value is within the reference resistance range and a second logical value is read when the resistance value is outside the reference resistance range.

* * * * *